US012789724B2

(12) United States Patent
Nagase

(10) Patent No.: US 12,789,724 B2
(45) Date of Patent: Nov. 10, 2026

(54) ELECTRIFIED VEHICLE

(71) Applicant: TOYOTA JIDOSHA KABUSHIKI KAISHA, Toyota (JP)

(72) Inventor: Toshiyuki Nagase, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 82 days.

(21) Appl. No.: 18/906,404

(22) Filed: Oct. 4, 2024

(65) Prior Publication Data

US 2025/0236245 A1 Jul. 24, 2025

(30) Foreign Application Priority Data

Jan. 18, 2024 (JP) ................................ 2024-005997

(51) Int. Cl.

*B60R 16/02* (2006.01)
*H05K 5/03* (2006.01)
*H05K 5/04* (2006.01)

(52) U.S. Cl.

CPC ........... *B60R 16/0207* (2013.01); *H05K 5/03* (2013.01); *H05K 5/04* (2013.01)

(58) Field of Classification Search

None

See application file for complete search history.

(56) References Cited

U.S. PATENT DOCUMENTS

| | | | | | |
|---|---|---|---|---|---|
| 6,005,301 | A * | 12/1999 | Sova | B60R 25/04 439/135 |
| 2018/0001849 | A1* | 1/2018 | Abe | B60R 16/023 |
| 2018/0229668 | A1* | 8/2018 | Garcia | B60R 16/02 |
| 2020/0079200 | A1* | 3/2020 | Suzuki | B60K 1/00 |
| 2021/0036586 | A1* | 2/2021 | Schulz | H02K 5/225 |

FOREIGN PATENT DOCUMENTS

| | | |
|---|---|---|
| JP | 2012-149622 A | 8/2012 |
| JP | 2014-097727 A | 5/2014 |
| JP | 2020-089189 A | 6/2020 |

* cited by examiner

*Primary Examiner* — Regis J Betsch
*Assistant Examiner* — Joel Barnett
(74) *Attorney, Agent, or Firm* — SoraIP, Inc.

(57) ABSTRACT

An electrified vehicle including: a water heater disposed inside a front compartment; a high-voltage cable with connector to which a connector connected to the water heater is attached; and a cover member that covers the high-voltage cable with connector. The connector is connected to the water heater so as to protrude from the water heater in the vehicle width direction, and the cover member covers the front and top of the connector.

5 Claims, 4 Drawing Sheets

CROSS-SECTION IV-IV

ELECTRIFIED VEHICLE

CROSS-REFERENCE TO RELATED APPLICATION

This application claims priority to Japanese Patent Application No. 2024-005997 filed on Jan. 18, 2024, incorporated herein by reference in its entirety.

BACKGROUND

1. Technical Field

The present disclosure relates to structures of electrified vehicles that include a high-voltage component and a high-voltage cable with connector to which a connector connected to the high-voltage component is attached.

2. Description of Related Art

Japanese Unexamined Patent Application Publication No. 2012-149622 (JP 2012-149622 A) describes a vehicle including a wire harness routed on an outer surface of a transmission and a heat insulator disposed between the transmission and a muffler. In this vehicle, there is a structure in which clamps for holding and fixing therebetween a protector attached to the wire harness are provided on a surface on the transmission side of the heat insulator.

SUMMARY

In recent years, hybrid electric vehicles (HEVs) that run on an engine and a motor have been used. In HEVs, an engine and auxiliary equipment such as a high-voltage component and a radiator are housed in a front compartment at the front of a vehicle. A connector attached to a high-voltage cable is connected to the high-voltage component. When an HEV collides, the components housed in the front compartment such as the engine may move rearward and interfere with the connector. If any of the components housed in the front compartment interferes with the connector and the connector is damaged, a conductive portion of the connector to which a high voltage is applied may be exposed.

The present disclosure can reduce damage to a connector in the event of a collision of an electrified vehicle, and can reduce exposure of a conductive portion of the connector when the connector is damaged.

An electrified vehicle of the present disclosure includes: a high-voltage component disposed in a front compartment of a vehicle;

a high-voltage cable with connector to which a connector connected to the high-voltage component is attached; and a cover member that covers the high-voltage cable with connector.

The connector is connected to the high-voltage component so as to protrude from the high-voltage component in a vehicle width direction, and the cover member covers at least a front of the connector and a top of the connector.

As described above, the connector of the high-voltage cable with connector is covered by the cover member. This can reduce damage to the connector in the event of a collision of the electrified vehicle. Even if the connector is damaged by a collision and a conductive portion of the connector is exposed, the risk that a person may touch the exposed conductive portion is reduced because the exposed conductive portion is covered by the cover member.

The electrified vehicle of the present disclosure may further include a housing that is fixed to a rear of the front compartment and in which the high-voltage component is mounted.

The connector may be connected to the high-voltage component so as to protrude from an end in the vehicle width direction of the housing in the vehicle width direction.

The cover member may be attached to the housing so as to cover at least the front of the connector and the top of the connector.

As described above, the cover member is attached to the housing. This can effectively reduce damage to the connector in the event of a collision of an electrified vehicle. The cover member reliably covers the connector in the event of a collision. Accordingly, even if the conductive portion of the connector is exposed, the exposed conductive portion can be reliably covered by the cover member. This effectively reduces the risk that a person may touch the exposed conductive portion.

In the electrified vehicle of the present disclosure, the cover member may cover the high-voltage cable with connector from outside in the vehicle width direction.

With this configuration, even if the conductive portion of the connector or a conductive portion of the high-voltage cable is exposed in the event of a collision, the risk that a person may touch the exposed conductive portion is reduced.

The electrified vehicle of the present disclosure may further include a connecting member that connects the connector and the cover member.

This reduces scattering of the connector even if the connector is damaged by a collision, and reduces exposure of the conductive portion of the connector when the connector is damaged.

In the electrified vehicle of the present disclosure, the housing may be made of a metal, and the cover member may be a conductor.

The electrified vehicle may further include a conductive member that electrically connects a shielded wire of the high-voltage cable with connector and the cover member.

This allows the cover member and the vehicle body to have the same potential, which reduces the risk of an electric shock when a person touches the cover member and the vehicle body at the same time.

The electrified vehicle of the present disclosure can reduce damage to the connector in the event of a collision of the electrified vehicle, and can reduce exposure of the conductive portion of the connector when the connector is damaged.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
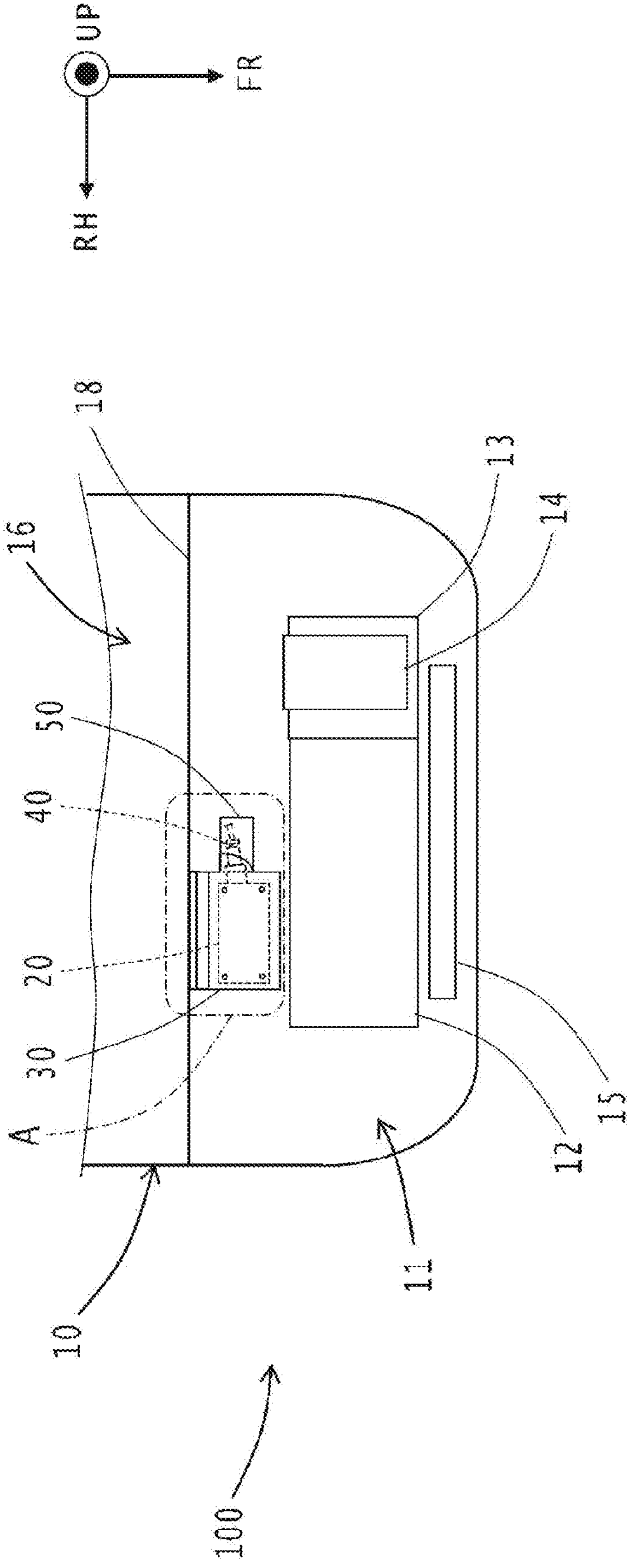
FIG. 1 is a schematic plan view of a front-compartment of an electrified vehicle according to an embodiment.

Hereinafter, electrified vehicle 100 of embodiments will be described referring to the drawings. As shown in FIG. 1, electrified vehicle 100 includes a body 10. The body 10 includes a vehicle cabin 16 and a front compartment 11. The front compartment 11 is a space in front of vehicles that accommodates devices such as electrified vehicle 100 driving devices. The vehicle cabin 16 is a space in which a driver or a passenger rides. The vehicle cabin 16 and the front compartment 11 are partitioned by a dash panel 18. Note that FR, UP, RH shown in the drawings indicate the front side, the upper side, and the right side of electrified vehicle 100, respectively. In addition, the opposite directions of FR, UP, RH indicate the rear side, the lower side, and the left side. Hereinafter, when simply describing using the front-rear, left-right, and up-down directions, the front-rear, left-right, and up-down directions of electrified vehicle 100 in the front-rear direction, the left-right direction, and the up-down direction, unless otherwise specified.

An engine 12, a motor 13, a power control unit 14, and a radiator 15 are disposed inside the front compartment 11 of electrified vehicle 100. Electrified vehicle 100 is a hybrid electrified vehicle (HEV) that runs between the motor 13 and the engine 12. Further, a water heater 20, a housing 30, a high-voltage cable with connector 40, and a cover member 50 are disposed at a rear portion of the front compartment 11.

The water heater 20 is a heating device that heats water passing through the heater core for heating the vehicle cabin 16. The water heater 20 is supplied with high-voltage drive power from a high-voltage cable with connector 40. Here, the high voltage refers to a voltage higher than a low voltage of the order of 12 V for driving an auxiliary machine, for example, a voltage from 100 V to 300 V. Thus, the water heater 20 is a high-voltage component to which high voltage power is supplied.

Figure 2:
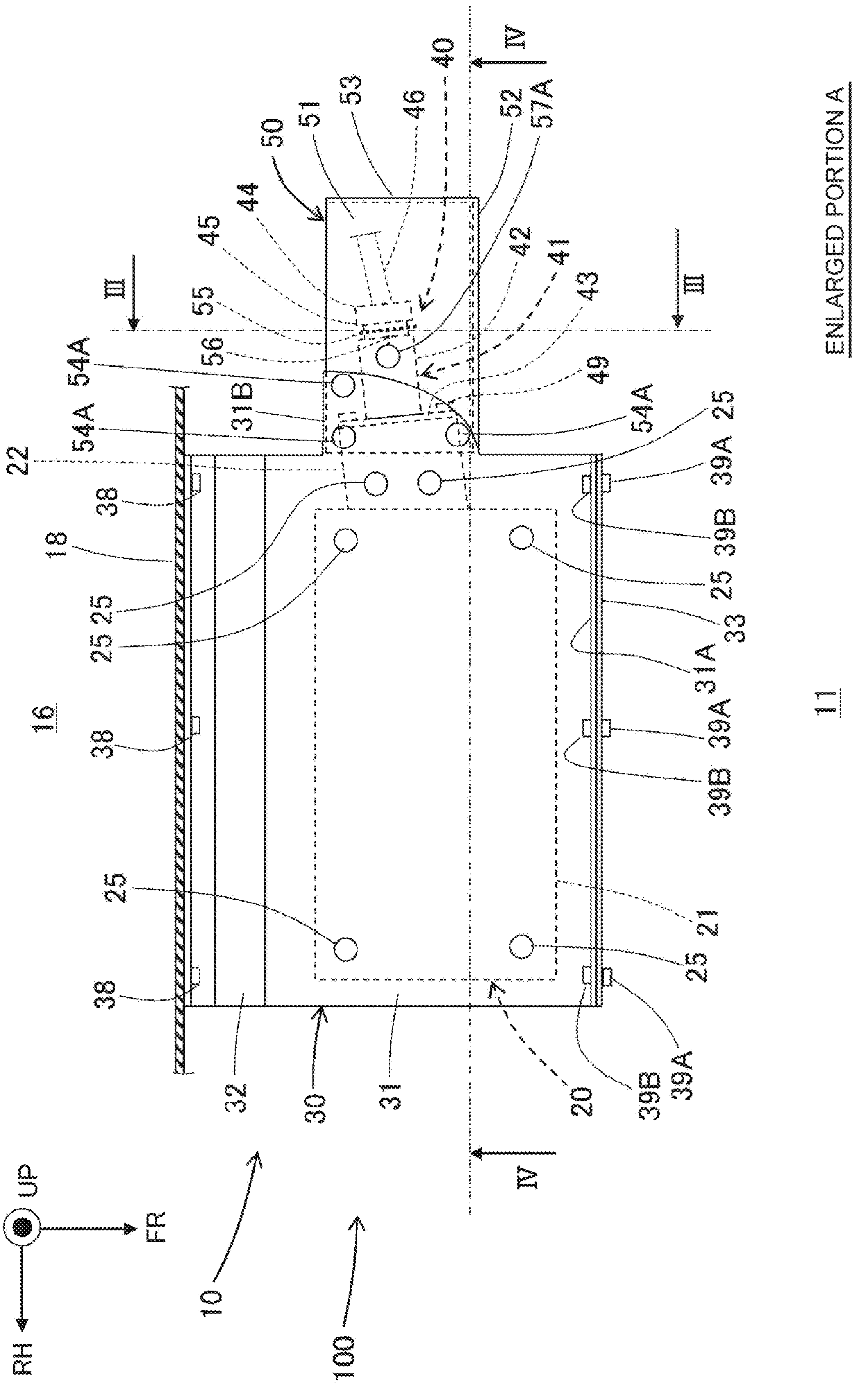
FIG. 2 is an enlarged plan view of a part including the water heater of electrified vehicle of the embodiment, and is an enlarged plan view of the part A shown in FIG. 1.
Figure 3:
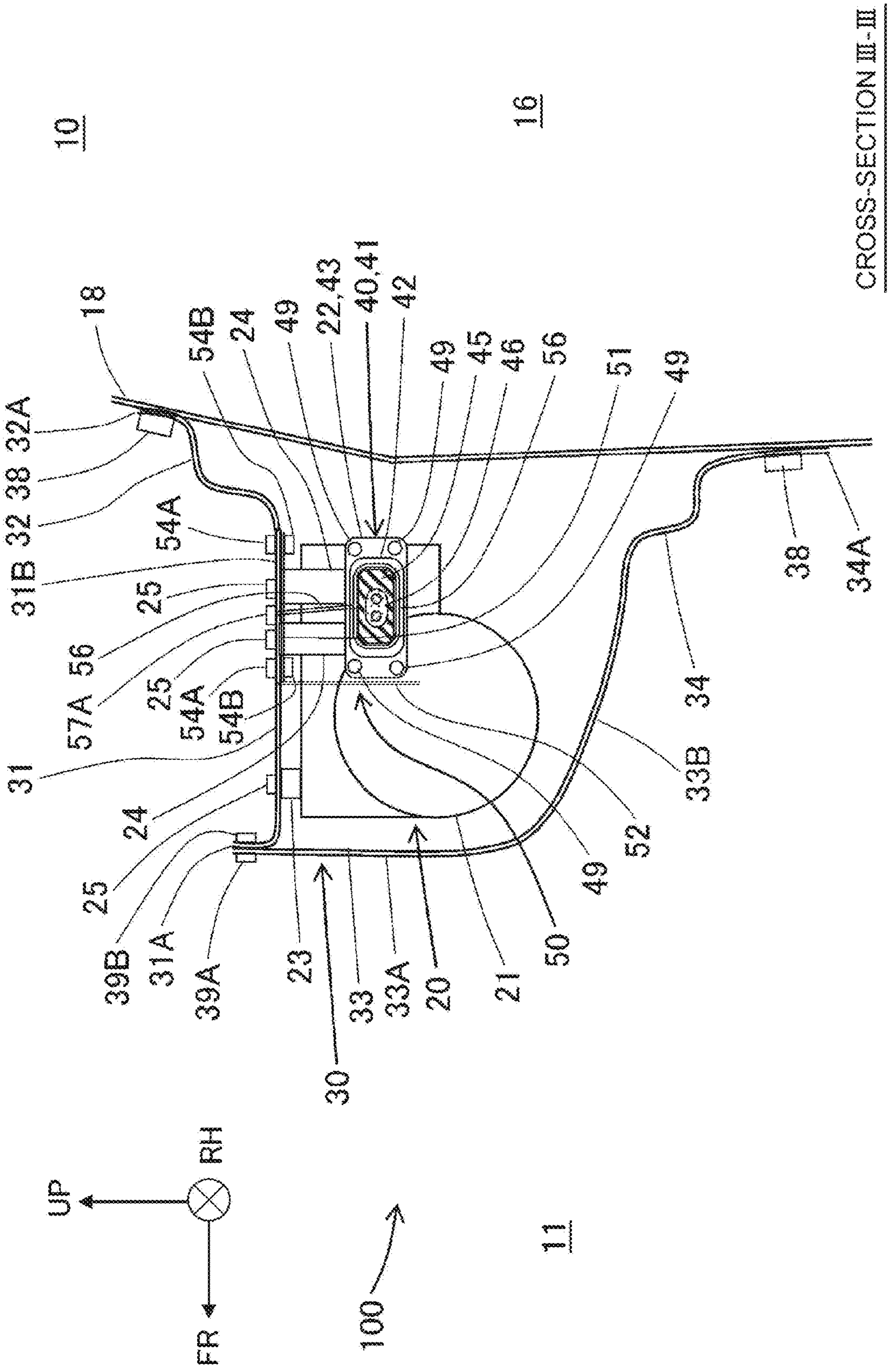
FIG. 3 is a cross-sectional view of a part including the water-heater of electrified vehicle of the embodiment, which is a III-III cross-section shown in FIG. 2.
Figure 4:
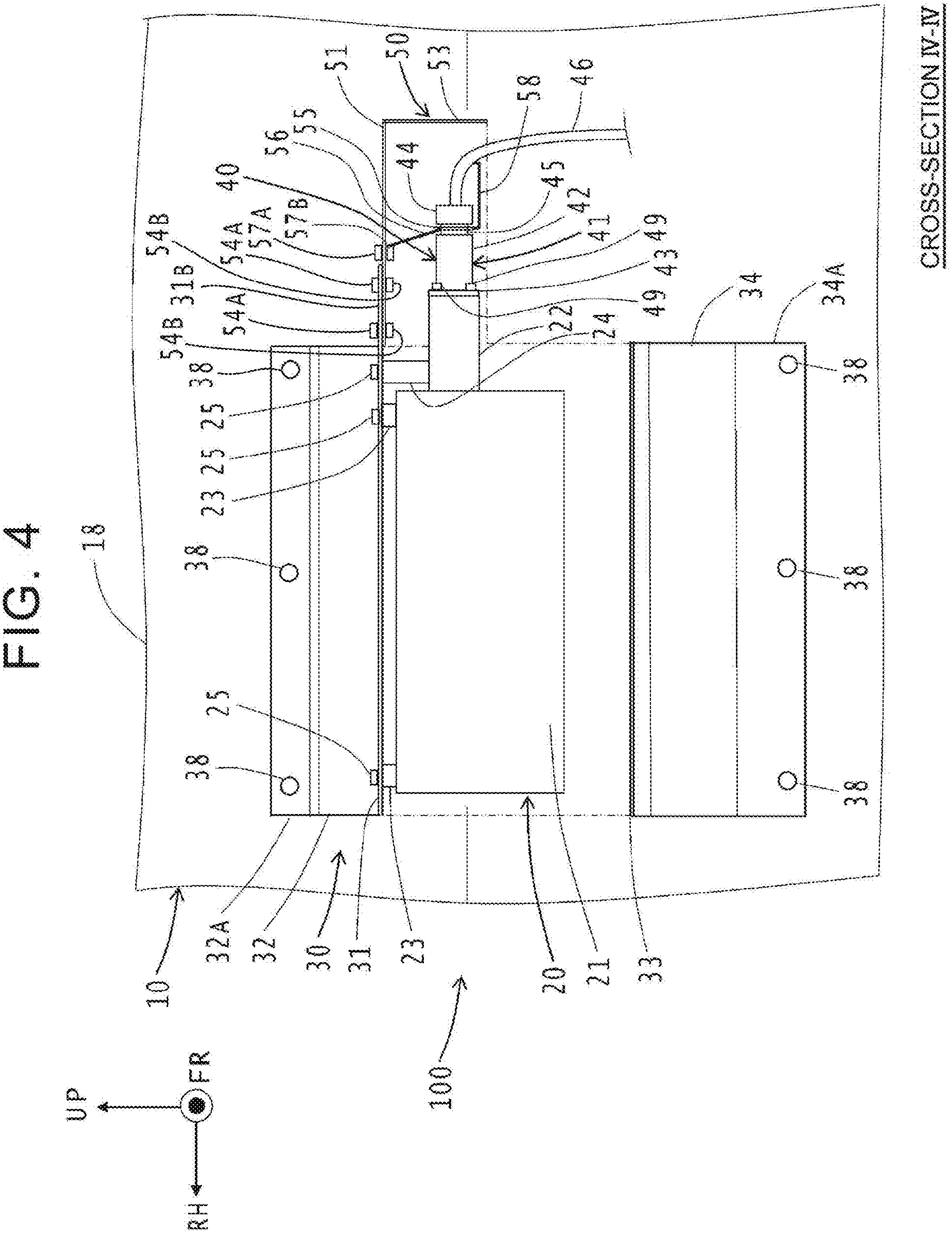
FIG. 4 is an elevational cross-sectional view of a part including the water-heater of electrified vehicle of the embodiment, which is an IV-IV cross-section shown in FIG. 2.

As shown in FIG. 2, the water heater 20 is made of metal and includes a heater main body 21 and a connector receiving seat 22. As shown in FIGS. 2 and 3, the connector receiving seat 22 is a square cross-sectional portion protruding from the left end surface of the heater main body 21 toward the left side. As shown in FIGS. 3 and 4, bosses 23 and 24 extending upward are provided in the upper portions of the heater main body 21 and the connector receiving seat 22. As shown in FIGS. 3 and 4, the boss 23 of the heater main body 21 and the boss 24 of the connector receiving seat 22 are fixed to the lower surface of the upper plate 31 of the housing 30 by bolts 25. In this manner, the water heater 20 is mounted inside the housing 30.

As shown in FIGS. 2 to 4, the high-voltage cable with connector 40 includes a connector 41 and a high-voltage cable 46. The connector 41 includes a connector main body 42, a connection flange 43, a left end portion 44, and a small diameter portion 45. The connector main body 42 is a longitudinal member having a rectangular cross section made of resin. The connection flange 43 is attached to a right end portion of the connector main body 42. The external dimensions of the connection flange 43 are larger than the external dimensions of the connector main body 42 and are substantially the same as the external dimensions of the connector receiving seat 22. Bolt holes are provided at four corners of the connection flange 43. The left end of the connector main body 42 is connected to the small diameter portion 45 having a smaller outer shape than the connector main body 42. The right end of the small diameter portion 45 is connected to the left end portion 44 having substantially the same external dimensions as the connector main body 42. Accordingly, the small diameter portion 45 forms a square annular recess between the connector main body 42 and the left end portion 44. A metal fixing ring 55 is fitted into the small diameter portion 45. A high-voltage cable 46 is attached to the left end portion 44.

The connection flange 43 is connected to the connector receiving seat 22 by four bolts 49. When the connection flange 43 is fixed to the connector receiving seat 22 by the bolt 49, the conductor inside the high-voltage cable 46 and the electric heater (not shown) disposed inside the water heater 20 are electrically connected to each other. Further, as shown in FIGS. 2 and 4, when the connection flange 43 is fixed to the connector receiving seat 22 by the bolt 49, the connector 41 protrudes leftward from the connector receiving seat 22 along the vehicle width direction.

As shown in FIG. 3, the housing 30 is made of metal and is a longitudinal member having a substantially groove-shaped cross section with an open rear side of the vehicle. A water heater 20 is housed in the groove-shaped internal space. The housing 30 includes an upper plate 31, an upper flange portion 32, a front plate 33, and a lower flange portion 34. The upper plate 31 is a flat plate member extending in the vehicle width direction, and a front flange 31A curved in the upward direction and extending in the upward direction is formed at a front edge portion. Further, a bracket portion 31B protruding leftward provided at the left end portion of the upper plate 31. The bracket portion 31B is a flat plate portion having a ¼ circular shape.

The upper flange portion 32 is a portion that is connected to the rear edge of the upper plate 31 and extends in a crank shape toward the vehicle upward direction. The upper end portion of the upper flange portion 32 is an upper flange 32A extending upward along the front surface of the dash panel 18. The upper flange 32A is fixed to the front surface of the dash panel 18 by bolts 38.

The front plate 33 includes a vertical plate portion 33A and a horizontal plate portion 33B. The vertical plate portion 33A is a portion extending downward from the front flange 31A by being connected to the front flange 31A of the upper plate 31 by the bolt 39A and the nut 39B. The horizontal plate portion 33B is a portion that is connected to the lower end portion of the vertical plate portion 33A, is curved from the lower end portion of the vertical plate portion 33A toward the rear of the vehicle, and extends obliquely rearward of the vehicle.

The lower flange portion 34 is connected to the rear edge of the horizontal plate portion 33B and extends in a crank-like manner toward the lower side of the vehicle. The lower end portion of the lower flange portion 34 has a lower flange 34A extending downward along the front surface of the dash panel 18. The lower flange 34A is fixed to the front surface of the dash panel 18 by bolts 38.

As described above, in the housing 30, the upper flange 32A and the lower flange 34A are fixed to the dash panel 18 constituting the rear portion of the front compartment 11 by the bolts 38.

As illustrated in FIGS. 2 to 4, the cover member 50 includes a ceiling plate 51, a front side plate 52, and a left end plate 53. The cover member 50 is formed of a conductive member such as metal. The ceiling plate 51 is a flat plate member fastened to the lower surface of the upper plate 31 on the bracket portion 31B by the bolt 54A and the nut 54B.

The front side plate 52 is a flat plate member extending downward from the front edge of the ceiling plate 51. The left end plate 53 is a flat plate member extending downward from a left end portion of the ceiling plate 51. The front end portion of the left end plate 53 is connected to the left end portion of the front side plate 52.

As shown in FIG. 4, the metal fixing ring 55 fitted into the small diameter portion 45 between the connector main body 42 and the left end portion 44 is connected to the metal connecting member 56. The connecting member 56 is connected to the ceiling plate 51 of the cover member 50 by a bolt 57A and a nut 57B. The fixing ring 55 and the shielded wire of the high-voltage cable 46 are connected by a conductive wire 58. Accordingly, the shielded wire of the high-voltage cable 46 and the ceiling plate 51 are electrically connected to each other by the conductive wire 58, the metal fixing ring 55, and the metal connecting member 56. The wire 58, the fixing ring 55, and the connecting member 56 constitute a conductive member that electrically connects the shielded wire of the high-voltage cable 46 and the cover member 50.

In electrified vehicle 100 configured as described above, the heater main body 21 is mounted inside the housing 30. The upper surface of the heater main body 21 is covered with the upper plate 31, and the front surface and the lower surface of the heater main body 21 are covered with the vertical plate portion 33A and the horizontal plate portion 33B of the front plate 33. Further, the upper surface and the front surface of the right half of the connector receiving seat 22 is covered with the upper plate 31 and the front plate 33.

On the other hand, as shown in FIGS. 2 and 4, the left half of the connector receiving seat 22 protrudes leftward from the left end faces of the upper plate 31 and the front plate 33 of the housing 30. Therefore, the left half of the connector receiving seat 22 is not covered with the upper plate 31 and the front plate 33 of the housing 30. Further, as shown in FIGS. 2 and 4, the connector 41 is fixed to the left end surface of the connector receiving seat 22 so as to project leftward from the connector receiving seat 22 along the vehicle width direction. That is, the connector 41 is connected to the connector receiving seat 22 so as to protrude leftward in the vehicle width direction from the left end which is the vehicle width direction end of the housing 30. Therefore, the high-voltage cable with connector 40 also protrudes leftward from the left end of the housing 30, and is not covered with the upper plate 31 and the front plate 33 of the housing 30.

However, the upper surface and the front surface of the left half of the connector receiving seat 22 are covered with the ceiling plate 51 and the front side plate 52 of the cover member 50. Further, the upper and front of the high-voltage cable with connector 40 is covered with the ceiling plate 51 and the front side plate 52 of the cover member 50. Further, the left end surface of the high-voltage cable with connector 40 is covered from the left side by the left end plate 53 of the cover member 50. As described above, the left end surface of the high-voltage cable with connector 40 is covered from the outside in the vehicle width direction.

As described above, in electrified vehicle 100 of the embodiment, the connector 41 of the high-voltage cable with connector 40 is covered with the cover member 50. Therefore, it is possible to prevent the connector 41 from being damaged when electrified vehicle 100 collides. Further, since the exposed conductive portion is covered with the cover member 50 even when the connector 41 is damaged by the collision and the conductive portion of the connector 41 is exposed, it is possible to prevent the person from touching the exposed conductive portion. Further, since the cover member 50 is attached to the housing 30, the connector 41 can be effectively prevented from being damaged when electrified vehicle 100 collides. Further, since the cover member 50 when electrified vehicle 100 collides surely covers the connector 41 without scattering, even when the conductive portion of the connector 41 is exposed, it is possible to surely cover the exposed conductive portion with the cover member 50. Accordingly, it is possible to effectively suppress the person from touching the exposed conductive portion.

Further, in electrified vehicle 100 of the embodiment, the fixing ring 55 is attached to the small diameter portion 45 of the connector 41, and the fixing ring 55 and the ceiling plate 51 of the cover member 50 are connected by the connecting member 56. Accordingly, even when the connector 41 is damaged due to a collision, scattering of the connector 41 can be suppressed, and when the connector 41 is damaged, the conductive portion of the connector 41 can be suppressed from being exposed.

Further, in electrified vehicle 100 of the embodiment, the shielded wire of the high-voltage cable 46 and the cover member 50 are electrically connected by the wire 58, the fixing ring 55, and the connecting member 56. This allows the cover member 50 and the body 10 of the electrified vehicle 100 to have the same potential, which reduces the risk of an electric shock when a person touches the cover member 50 and the body 10 at the same time.

As described above, electrified vehicle 100 of the embodiment suppresses the connector 41 from being damaged when electrified vehicle 100 collides. At the same time, in electrified vehicle 100 of the embodiment, it is possible to prevent the conductive portion of the connector 41 from being exposed when the connector 41 is damaged.

In the above description, the high-voltage component has been described as the water heater 20, but the present disclosure is not limited thereto. Other electric devices may be used as long as the electric devices are supplied with electric power having a voltage higher than the low voltage of the order of 12 V for driving the auxiliary devices.

Further, in electrified vehicle 100 of the embodiment, the connector receiving seat 22 of the water heater 20 protrudes toward the left side of the heater main body 21, and the connector 41 protrudes leftward from the connector receiving seat 22. Further, in electrified vehicle 100 of the embodiment, the cover member 50 is described as being attached to the bracket portion 31B provided at the left end portion of the upper plate 31 of the housing 30. However, it is not limited thereto. For example, the connector receiving seat 22 of the water heater 20 may protrude toward the right side of the heater main body 21, and the connector 41 may protrude toward the right from the connector receiving seat 22. In addition, the cover member 50 may be attached to the bracket portion 31B provided at a right end portion of the upper plate 31 of the housing 30. In this case, the vehicle width direction end of the housing 30 is the right end. Also in this case, it is possible to suppress damage to the connector 41 when electrified vehicle 100 collides, and to suppress exposure of the conductive portion of the connector 41 when the connector 41 is damaged.

What is claimed is:

1. An electrified vehicle comprising:

a high-voltage component disposed in a front compartment of the electrified vehicle;

a high-voltage cable including a shielded wire and a connector connected to the high-voltage component;

a conductive cover member including a ceiling plate and an end plate extending downward in a vehicle height direction from an end portion of the ceiling plate;

a housing fixed to a rear of the front compartment, in which the high-voltage component is mounted, and to which the conductive cover member is attached, the housing being made of metal;

a first connecting member made of metal and connecting the connector and the ceiling plate; and a second connecting member connecting the shielded wire and the connector, the second connecting member being a conductive wire, wherein the connector includes an end portion that protrudes, in a vehicle width direction, from an end of the housing in the vehicle width direction, the conductive cover member covers the high-voltage cable and the end portion of the connector in the vehicle width direction, and the ceiling plate of the conductive cover member covers an upper portion of the connector in the vehicle height direction.

2. The electrified vehicle according to claim 1, wherein the conductive cover member covers the high-voltage cable from outside in the vehicle width direction.

3. The electrified vehicle according to claim 1, wherein:

the connector includes a main body and a small diameter portion;

an outer diameter of the small diameter portion is smaller than an outer diameter of the main body;

the small diameter portion is disposed between the main body and the end portion of the connector;

the electrified vehicle further includes a fixing ring fitted into the small diameter portion, the fixing ring being made of metal; and the fixing ring and the ceiling plate are connected via the first connecting member.

4. The electrified vehicle according to claim 1, wherein:

the shielded wire and the conductive cover member are electrically connected to each other via the first connecting member, the connector, and the second connecting member so that the conductive cover member and a body of the electrified vehicle have the same electric potential.

5. The electrified vehicle according to claim 1, wherein:

the ceiling plate is disposed at a position facing the upper portion of the connector; and the end plate is disposed at a position facing the end portion of the connector.

* * * * *